(12) United States Patent
Ishii et al.

(10) Patent No.: US 9,534,895 B2
(45) Date of Patent: Jan. 3, 2017

(54) VIBRATING ELEMENT, ANGULAR VELOCITY SENSOR, ELECTRONIC APPARATUS, AND MOVING OBJECT

(71) Applicant: Seiko Epson Corporation, Tokyo (JP)

(72) Inventors: Masahiro Ishii, Suwa (JP); Takayuki Kikuchi, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 14/852,796

(22) Filed: Sep. 14, 2015

(65) Prior Publication Data

US 2016/0087190 A1  Mar. 24, 2016

(30) Foreign Application Priority Data

Sep. 24, 2014  (JP) ................. 2014-193775

(51) Int. Cl.
*H03H 9/25* (2006.01)
*G01C 19/5607* (2012.01)
*H03H 9/21* (2006.01)

(52) U.S. Cl.
CPC ............ *G01C 19/5607* (2013.01); *H03H 9/21* (2013.01)

(58) Field of Classification Search
CPC ..... B06B 1/0659; G01C 19/5607; H03H 3/04; H03H 2003/026; H03H 2003/0492; H03H 9/21; H03H 9/215; H03H 9/2468; H03H 9/2473; H03H 9/2484; H03H 9/2494
USPC ........................................ 310/370
See application file for complete search history.

(56) References Cited

U.S. PATENT DOCUMENTS

| | | | |
|---|---|---|---|
| 2005/0285483 A1* | 12/2005 | Satoh | H03H 3/02 310/370 |
| 2011/0198969 A1 | 8/2011 | Furuhata et al. | |
| 2013/0076211 A1* | 3/2013 | Arimatsu | G04R 20/10 310/370 |
| 2013/0239685 A1* | 9/2013 | Ishii | G01C 19/5607 73/504.15 |
| 2015/0040664 A1* | 2/2015 | Ishii | G01C 19/5607 73/504.16 |
| 2016/0182012 A1* | 6/2016 | Lim | H03H 9/21 310/370 |

FOREIGN PATENT DOCUMENTS

| | | | |
|---|---|---|---|
| JP | 2012257141 A | * | 12/2012 |
| JP | 2013-157703 A | | 8/2013 |
| JP | 2013-190304 A | | 9/2013 |
| JP | 2013-190306 A | | 9/2013 |
| JP | 2013-192013 A | | 9/2013 |
| JP | 2014064205 A | * | 4/2014 |
| WO | 2010047115 A1 | | 4/2010 |

* cited by examiner

*Primary Examiner* — J. San Martin

(57) ABSTRACT

A vibrating element includes a vibration portion including a first main surface, a second main surface, a first side surface, and a second side surface, and extending in a first direction. The vibration portion includes a first groove formed in the first main surface and a second groove formed in the second main surface, and in a plan view seen from a direction perpendicular to the first main surface, the first groove and the second groove are provided to shift in opposite directions from each other, in a second direction.

20 Claims, 12 Drawing Sheets

VIBRATING ELEMENT, ANGULAR VELOCITY SENSOR, ELECTRONIC APPARATUS, AND MOVING OBJECT

BACKGROUND

1. Technical Field

The present invention relates to a vibrating element, an angular velocity sensor, an electronic apparatus, and a moving object.

2. Related Art

For example, a gyro sensor of JP-A-2013-157703 has been known as a vibrating element that detects an angular velocity. As illustrated in FIGS. 2 and 3 of JP-A-2013-157703, the sectional shape of a drive arm of this gyro sensor is asymmetrical with respect to a centerline in a width direction and a center line in a thickness direction of the drive arm. This structure enables an oblique vibration as illustrated in FIG. 6 of JP-A-2013-157703 by a simple process.

According to the structure disclosed in JP-A-2013-157703, since a drive arm can obliquely vibrate, but the rigidity of the drive arm is weak, unnecessary vibration such as torsional vibration is applied. Therefore, electrical characteristics of an angular velocity signal to be detected (noise and stability) need to be improved.

SUMMARY

An advantage of some aspects of the invention is to provide a vibrating element, an angular velocity sensor, an electronic apparatus, and a moving object, each of which is capable of generating stable oblique vibration while suppressing unnecessary vibration.

(1) An aspect of the invention relates to a vibrating element comprising a base, and a vibration portion extending to a first direction from the base, wherein the vibration portion includes a first main surface, a second main surface located on the opposite side of the first main surface, a first side surface, a second side surface located on the opposite side of the first side surface, a first groove formed on the first main surface, and a second groove formed on the second main surface, wherein in a plan view seen from a direction perpendicular to the first main surface, the first groove is provided to shift further from the first side surface than the second groove, wherein in a cross section perpendicular to the first direction in which the vibration portion extends, a length a1 between a first open end on the first side surface side of the first groove and a first end at which the first main surface and the first side surface intersect each other is longer than a length b1 between a second open end on the second side surface side of the first groove and a second end at which the first main surface and the second side surface intersect each other, wherein in the cross section, a length a2 between a third open end on the second side surface side of the second groove and a third end at which the second main surface and the second side surface intersect each other is longer than a length b2 between a fourth open end on the first side surface side of the second groove and a fourth end at which the second main surface and the first side surface intersect each other, and wherein if a depth of the first groove is set to d1, a depth of the second groove is set to d2, and a distance between the first main surface and the second main surface is set to t, it is satisfied that d1+d2<t.

According to the aspect of the invention, since the first groove formed in the first main surface and the second groove formed in the second main surface are shifted and placed, they are asymmetric with respect to the center line in the width direction of the vibrating element and the center line in the thickness direction thereof. Therefore, it is possible to generate oblique vibration in the vibrating element. Further, in this aspect, the following Expressions are satisfied.

$$a1 > b1 \tag{1}$$

$$a2 > b2 \tag{2}$$

Thus, since the wall thickness a1 of the vibrating element on the second main surface side in the region facing the second groove and the wall thickness b2 of the vibrating element on the second main surface side in the region facing the first groove can be secured to be thick, the mechanical strength is increased. Thus, the rigidity of the vibrating element is increased, and the application of unwanted vibration such as torsional vibration can be suppressed.

In the aspect of the invention, the sum of the depth d1 of the first groove and the depth d2 of the second groove is smaller than the distance between the first main surface and the second main surface. Here, the deeper the depths d1 and d2 of the first and second grooves are, the smaller the impedance of the vibration portion is, but the processing is difficult. As the depths d1 and d2 of the first and second grooves become shallower, the processing becomes easier, and it is possible to increase the mechanical strength, by leaving a thick portion of the maximum width in the region between the first groove and the second groove.

(2) In the aspect of the invention, along a first center line bisecting a distance between the first main surface and the second main surface, the vibration portion may be formed continuously over a maximum width of the cross section.

With this configuration, since the vibration portions can be continuously formed over the maximum width of the cross section, on the first center line interposed between the first and second grooves, it is possible to further suppress the generation of torsion between the sites on the first and second groove sides having the first center line interposed therebetween.

(3) In the aspect of the invention, the first groove may be formed so as to be open to the first main surface between a second center line and the second side surface, the second center line bisecting a maximum width between the first side surface and the second side surface, and the second groove may be formed to be open to the second main surface between the second center line and the first side surface.

With this configuration, since the wall thickness a1 of the vibration portion on the first main surface side in a region facing the second groove and the wall thickness a2 of the vibration portion on the second main surface side in a region facing the first groove can be made thicker, the mechanical strength is increased. Thus, the rigidity of the vibrating element is further increased, and the application of unwanted vibration such as torsional vibration can be reduced.

(4) In the aspect of the invention, Expression (3) may be satisfied preferably, and further preferably Expression (4), and thus it is possible to ensure the wall thicknesses a1 and a2 thicker than in JP-A-2013-157703.

$$a1 > 2 \times b1 \text{ and } a2 > 2 \times b2 \tag{3}$$

$$a1 > 3 \times b1 \text{ and } a2 > 3 \times b2 \tag{4}$$

(5) In the aspect of the invention, when a distance between the first main surface and the second main surface is set to t, the depth d1 of the first groove and the depth d2 of the second groove may satisfy the following Expression (5).

$$d1+d2<t \quad (5)$$

In this case, it is possible to satisfy preferably Expression (6), further preferably Expression (7), and further preferably Expression (8). Here, the deeper the depths d1 and d2 of the first and second grooves are, the smaller the impedance of the vibration portion is, but the processing is difficult. As the depths d1 and d2 of the first and second grooves become shallower, the processing becomes easier, and it is possible to increase the mechanical strength, by leaving a thick portion of the maximum width in the region between the first groove and the second groove.

$$0.3t \le d1+d2 \le 0.95t \quad (6)$$

$$0.4t \le d1+d2 \le 0.9t \quad (7)$$

$$0.5t \le d1+d2 \le 0.8t \quad (8)$$

(6) In the aspect of the invention, when a distance between the first main surface and the second main surface is set to t, the depth d1 of the first groove and the depth d2 of the second groove may satisfy the following Expression (9).

$$d1<0.5t, \text{ and } d2<0.5t \quad (9)$$

From this numerical limitation, since the vibration portions can be continuously formed over the widest cross section, on the first center line interposed between the first and second grooves, it is possible to further suppress the generation of torsion between the sites on the first and second grooves side having the first center line interposed therebetween. In this case, it is possible to satisfy preferably Expression (10), further preferably Expression (11), and further preferably Expression (12).

$$0.15t \le d1 \le 0.475t, \text{ and } 0.15t \le d2 \le 0.475t \quad (10)$$

$$0.2t \le d1 \le 0.45t, \text{ and } 0.2t \le d2 \le 0.45t \quad (11)$$

$$0.25t \le d1 \le 0.4t, \text{ and } 0.25t \le d2 \le 0.4t \quad (12)$$

(7) In the aspect of the invention, in the cross section, if a maximum width between the first side surface and the second side surface is set to W and the opening width of the first groove and the opening width of the second groove are set to M, Expression (13) may be satisfied preferably, more preferably Expression (14), and further preferably Expression (15). As the opening widths M of the first groove and second groove become wider, the impedance CI is lowered, the oblique vibration component becomes larger, and the processing becomes easier. However, the wider the opening widths Mare, the lower the mechanical strength of the vibration portion is.

$$0.1W \le M \le 0.8W \quad (13)$$

$$0.2W \le M \le 0.7W \quad (14)$$

$$0.35W \le M \le 0.6W \quad (15)$$

(8) In the aspect of the invention, the vibrating element may further include a first drive unit and a second drive unit that are configured with the vibration portions extending in parallel to the first direction from the base, in which the first drive unit and the second drive unit may be arranged in line symmetry with respect to a line along the first direction, may vibrate in opposite phases in a direction parallel to the first main surface in the cross section, and may vibrate in the same phases in a direction perpendicular to the first main surface in the cross section.

Thus, it is possible to cause the first drive unit and the second drive unit to obliquely vibrate in line symmetry with respect to the line along the first direction.

(9) In the aspect of the invention, the vibrating element may further include a detection unit that bends and vibrates in response to Coriolis force applied to the first drive unit and the second drive unit, when the vibrating element rotates.

The detection unit can perform out-of-plane vibration corresponding to the vibration which is perpendicular to the first main surface, among line-symmetrical oblique vibrations of the first drive unit and the second drive unit. Thus, since the rotation around the shaft along the first direction is detected by utilizing the out-of-plane vibration, it is possible to increase the detection sensitivity.

(10) In the aspect of the invention, in a second direction which is perpendicular to the first direction in which the vibration portion extends, and is parallel to the first main surface, the first open end may be located closer to one side than the fourth open end, and the second open end may be located closer to one side than the third open end.

In a vibrating element according to another aspect of the invention, the shift in the second direction of the first and second grooves in this aspect of the invention is more clearly defined.

(11) In the aspect of the invention, the vibrating element may further include the third drive unit which extends in the opposite direction to the first drive unit along the first direction from the base and the fourth drive unit which extends in the opposite direction to the second drive unit along the first direction from the base, the third drive unit can have the same shape as that of the cross section of the first drive unit, and the fourth drive unit can have the same shape as the cross section of the second drive unit.

The first to fourth drive units are disposed in line symmetry with respect to each axis of two orthogonal axes in the plane in which the base is placed, and the vibration balance is improved.

(12) Another aspect of the invention relates to an angular velocity sensor including the vibrating element according to any one of (1) to (11), and a detection circuit that detects an angular velocity around an axis parallel to the first direction of the vibrating element. According to the angular velocity sensor, it is possible to suppress the vibration other than the oblique vibration in the drive unit. Thus, it is possible to suppress noise, to improve temperature characteristics, and to detect an angular velocity signal stably.

(13) Still another aspect of the invention relates to an electronic apparatus including the angular velocity sensor according to (12).

(14) Yet another aspect of the invention relates to a moving object including the angular velocity sensor according to (12).

BRIEF DESCRIPTION OF THE DRAWINGS

The invention will be described with reference to the accompanying drawings, wherein like numbers reference like elements.

DESCRIPTION OF EXEMPLARY EMBODIMENTS

A vibrating element, an angular velocity sensor, an electronic apparatus, and a moving object according to the invention will be described in detail below, based on embodiments illustrated in the accompanying drawings.

First Embodiment

Figure 1:
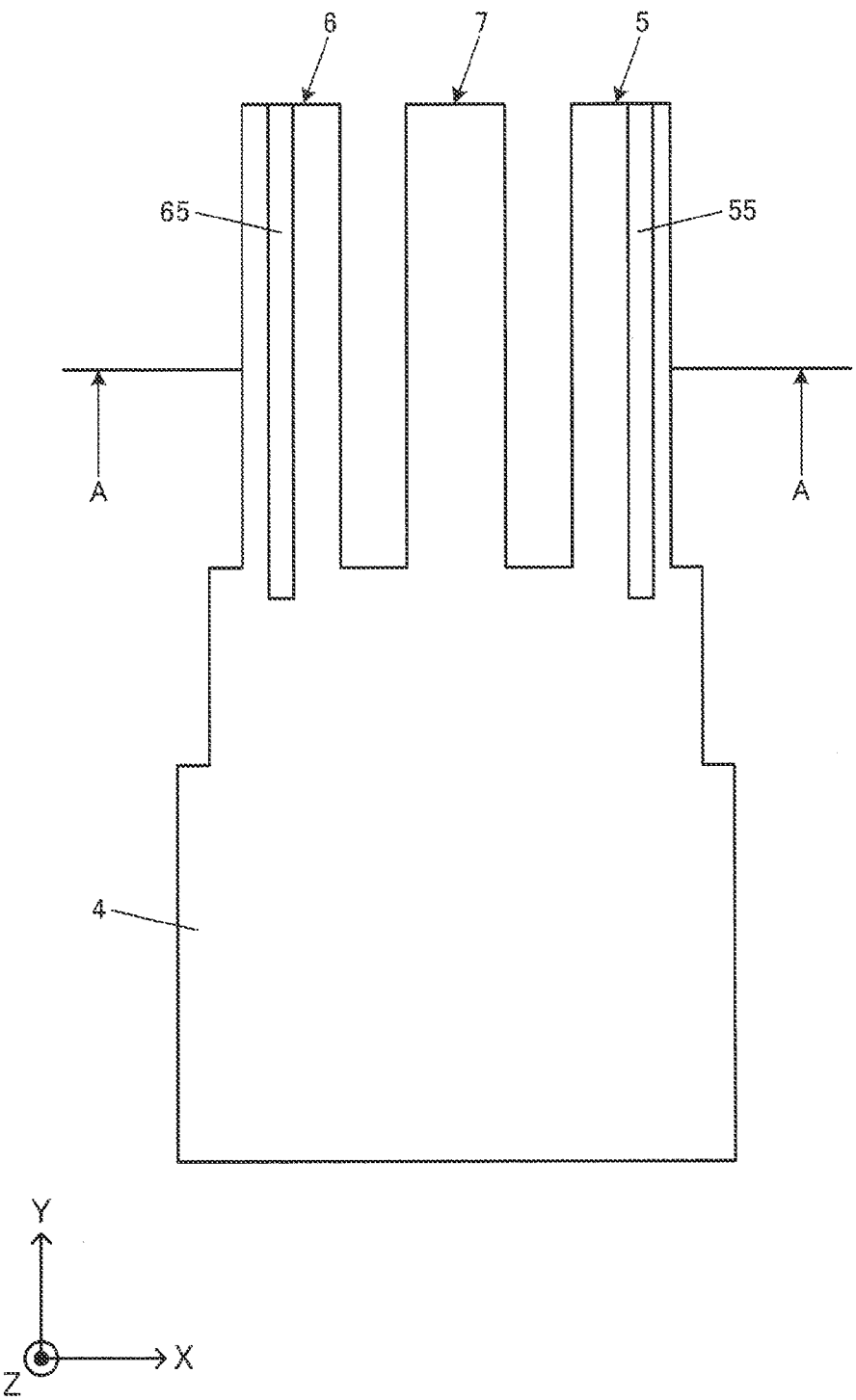
FIG. 1 is a plan view illustrating a vibrating element according to a first embodiment of the invention.
Figure 2:
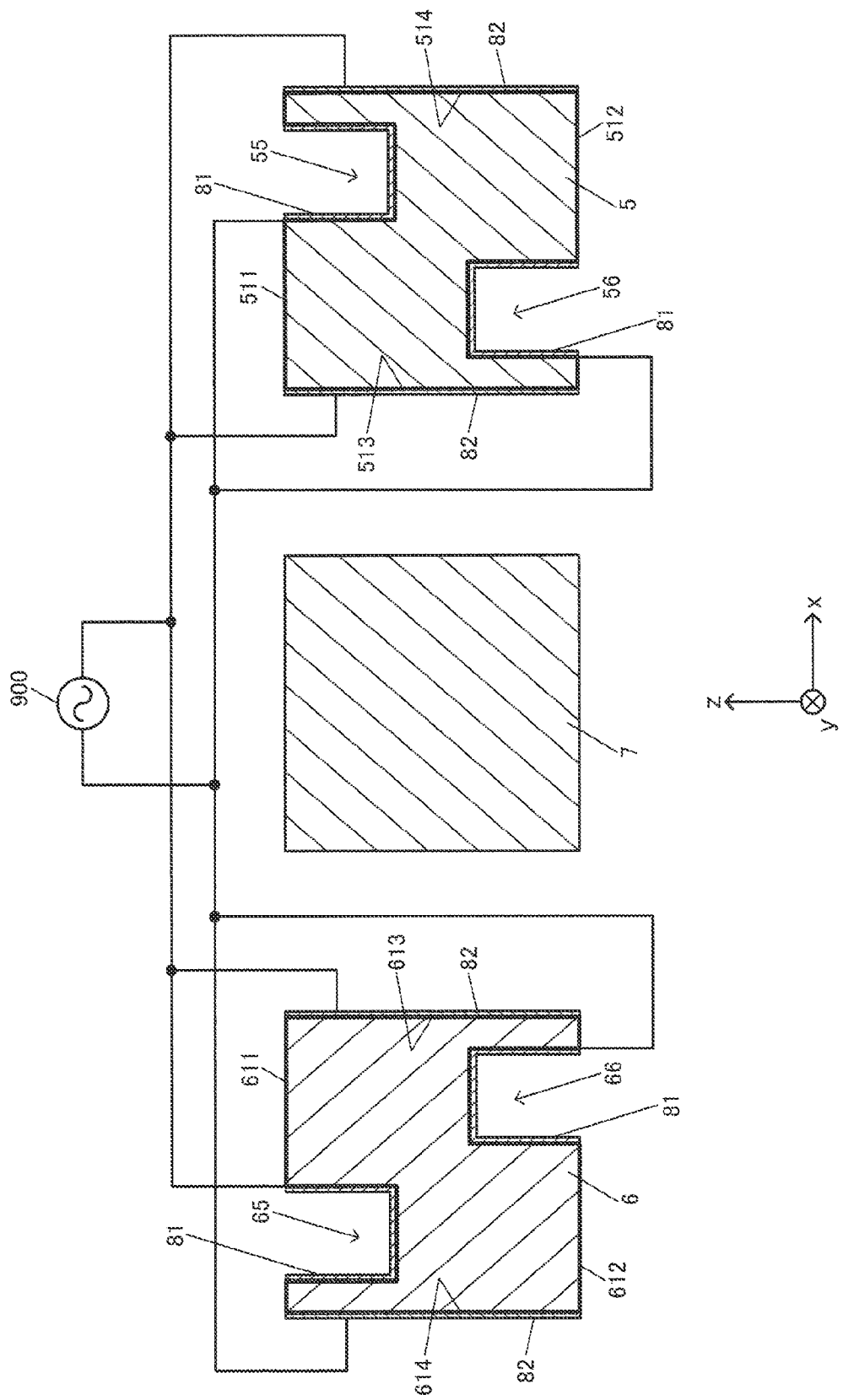
FIG. 2 is a sectional view taken along line A-A of FIG. 1.
Figure 3:
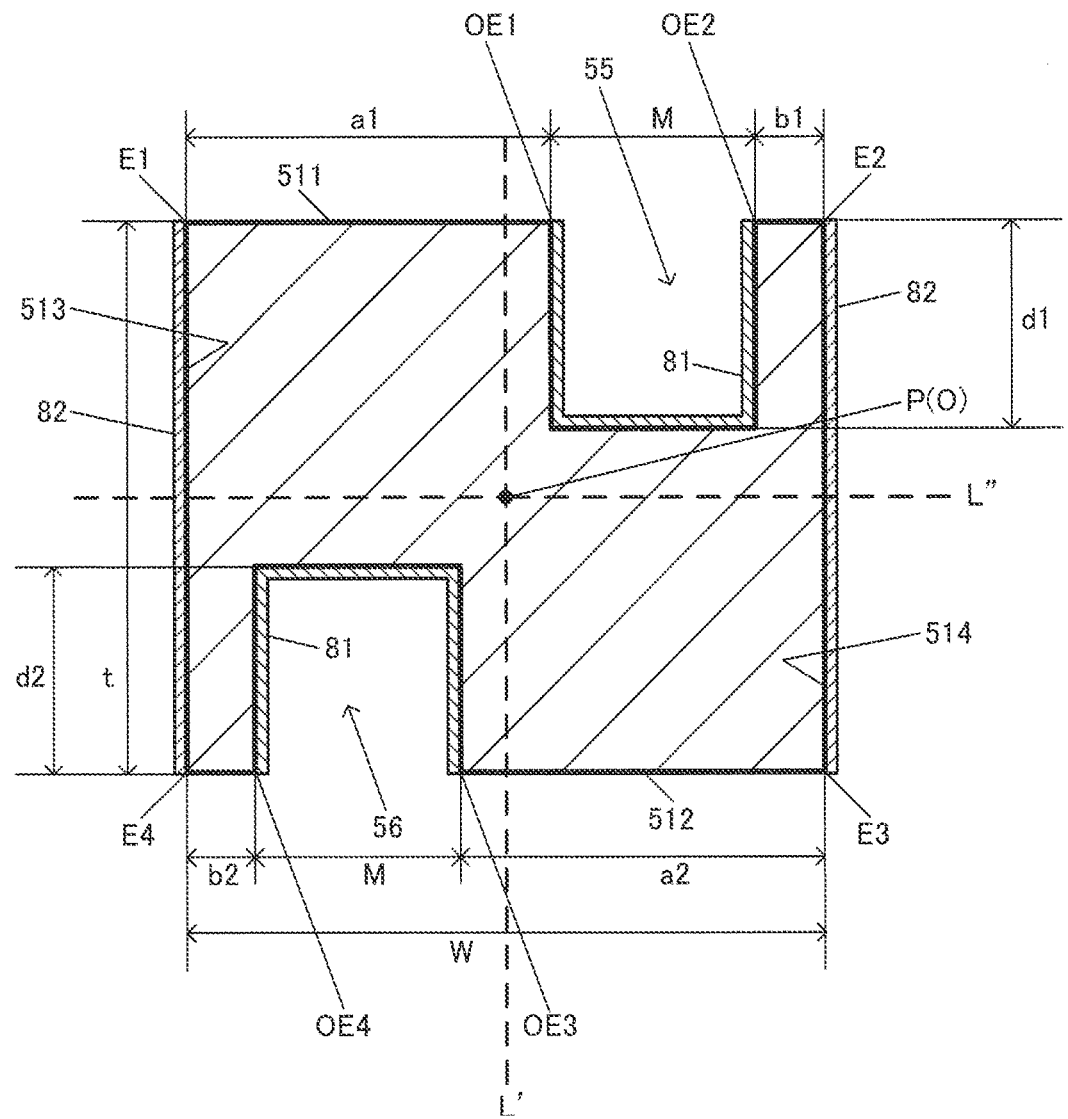
FIG. 3 is an enlarged sectional view of a drive arm illustrated in FIG. 2.
Figure 4:
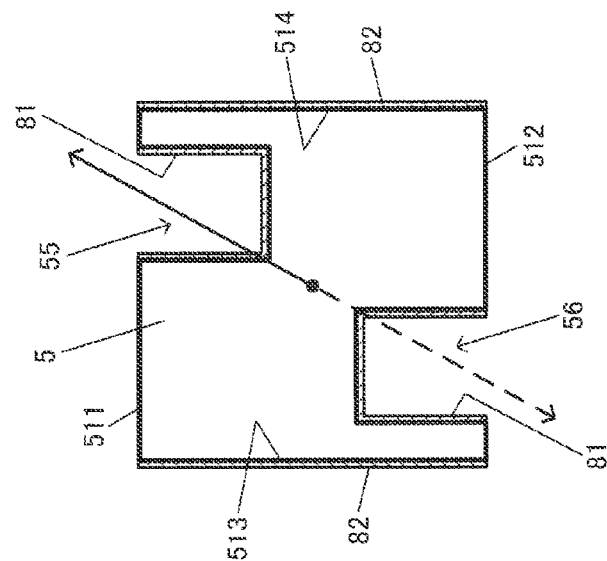
FIG. 4 is a sectional view illustrating an operation of the vibrating element illustrated in FIG. 1.
Figure 4:
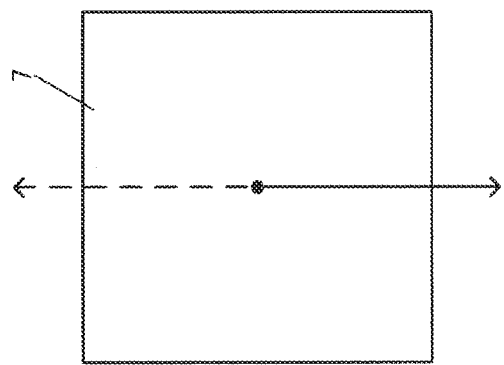
Figure 4:
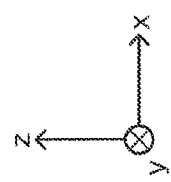
Figure 4:
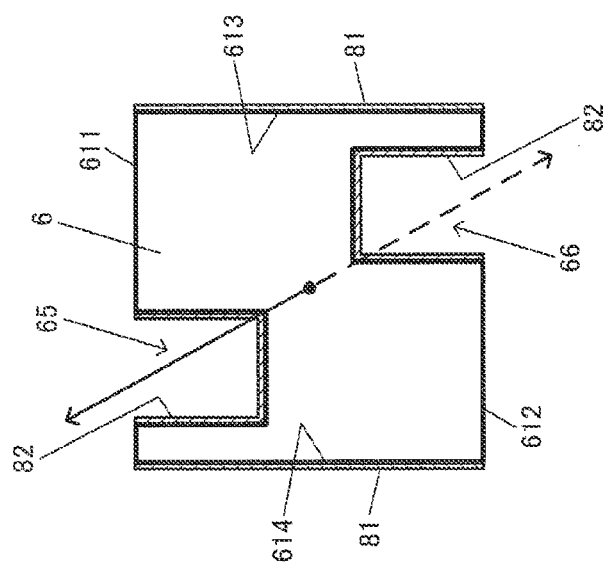
Figure 5:
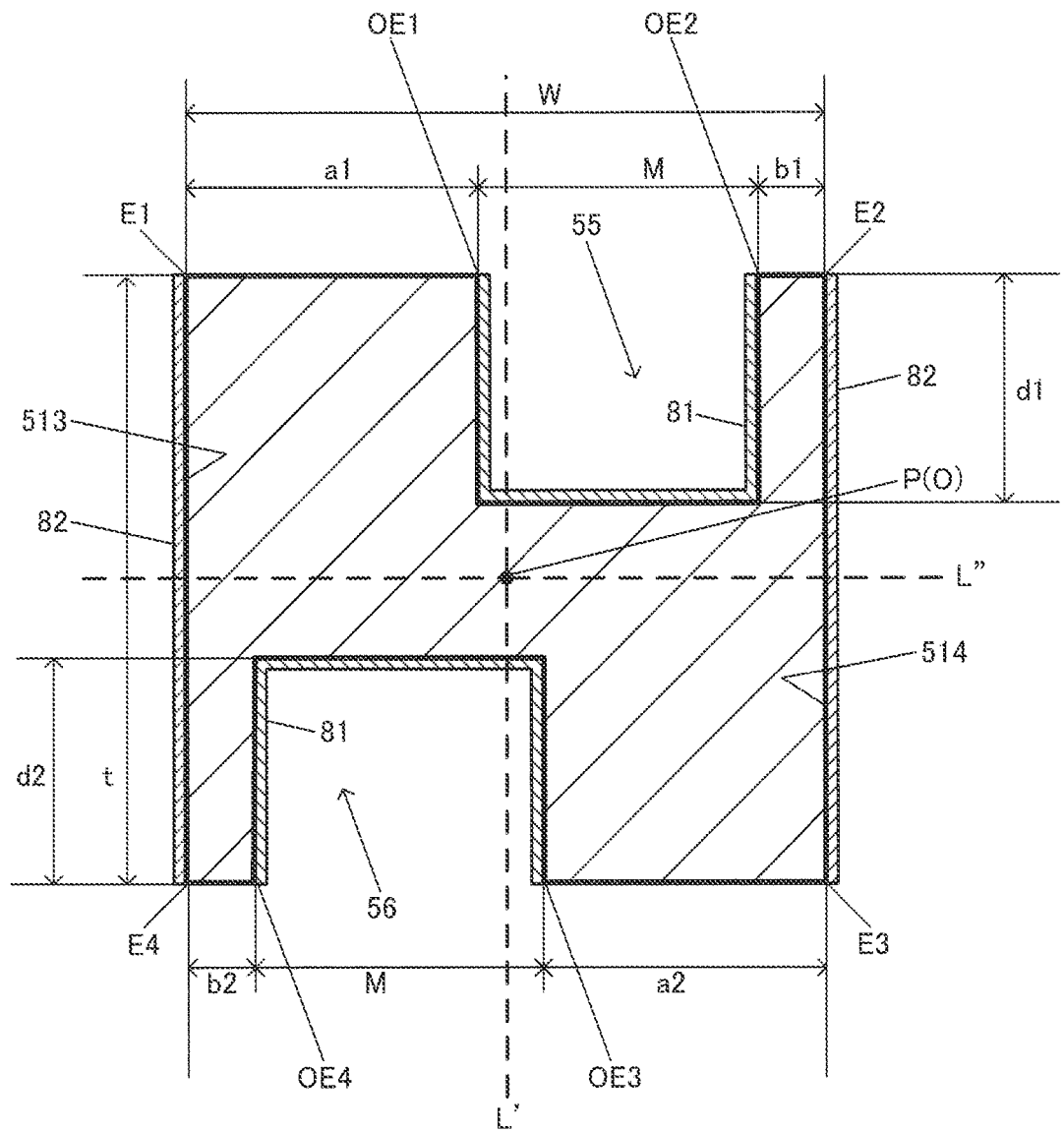
FIG. 5 is a sectional view illustrating a modification example of the drive arm illustrated in FIG. 3.

FIG. 1 is a plan view illustrating a vibrating element according to a first embodiment of the invention; FIG. 2 is a sectional view taken along line A-A of FIG. 1; FIG. 3 is an enlarged sectional view of a drive arm (a drive unit in a broad sense) illustrated in FIG. 2; FIG. 5 is a sectional view illustrating a modification example of the drive arm illustrated in FIG. 3; and FIG. 4 is a sectional view explaining an operation of the vibrating element illustrated in FIG. 1.

In each drawing, for convenience of explanation, an x-axis, a y-axis, and a z-axis are illustrated as three mutually orthogonal axes. In the following description, a direction parallel to the x-axis is referred to as "x-axis direction", a direction parallel to the y-axis is referred to as "y-axis direction" (also referred to as a first direction), and a direction parallel to the z-axis is referred to as "z-axis direction". In the following description, a plane defined by the x-axis and the y-axis is referred to as an "x-y plane", a plane defined by the y-axis and the z-axis is referred to as a "y-z plane", and a plane defined by the x-axis and the z-axis is referred to as an "x-z plane". In the following description, for convenience of explanation, the upper side, the lower side, the right side, and the left side in FIG. 1 are respectively referred to as "up", "down", "right", and "left".

Vibrating Element 2

First, a vibrating element 2 will be described. FIG. 1 illustrates a vibrating element 2 used as, for example, a gyro sensor element. The vibrating element 2 is, for example, a three-leg tuning fork type vibrating element. Further, the vibrating element 2 of this embodiment is used as a vibrator for generating an electrical signal that oscillates at a predetermined frequency (resonance frequency).

Such a vibrating element 2 includes a base 4, a piezoelectric substrate provided with three vibration arms (vibration portions in a broad sense) 5, 6, 7 extending from the base 4, and a plurality of electrodes formed on the piezoelectric substrate.

The piezoelectric substrate is made of a piezoelectric material. Examples of such piezoelectric material include quartz, lithium tantalate, lithium niobate, lithium borate, and barium titanate. In particular, quartz is preferable as the piezoelectric material constituting the piezoelectric substrate. By configuring the piezoelectric substrate of quartz (Z-cut plate, etc.), it can be assumed that the excellent vibration characteristics of the piezoelectric substrate are obtained (in particular frequency-temperature characteristic). Further, it is possible to form the piezoelectric substrate by etching with high dimensional accuracy. Incidentally, the piezoelectric substrate may not necessarily have piezoelectric properties, for example, a silicon substrate can be used, and the vibration arms 5, 6, 7 may be vibrated using a piezoelectric film.

Base 4

The base 4 has a plate-like shape and has a spread in the x-y plane, and a thickness in the z-axis direction. Further, the base 4 is formed so as to have the same thickness as that of the vibration arms 5, 6, and 7. Such a base 4 is connected to three vibration arms 5, 6, and 7.

Of these vibration arms 5, 6, and 7, the vibration arm 5 and 6 function as drive arms for driving the vibrating element 2, and the vibration arm 7 functions as an adjustment arm for cancelling out the vibration in the Z-direction of the vibration arms 5, 6. For convenience of explanation, in the following, the vibration arm 5 and the vibration arm 6 are respectively referred to as "drive arm 5" and "drive arm 6" (respectively, drive units in a broad sense), and the vibration arm 7 is also referred to as "adjustment arm 7".

The drive arms 5, 6 are connected to both ends in the x-axis direction of the base 4, and the adjustment arm 7 is connected to the central portion in the x-axis direction of the base 4. These three vibration arms 5 to 7 are provided to extend from the base 4 in the y-axis direction, so as to be parallel to each other. Further, three vibration arms 5 to 7 are spaced side by side at equal intervals in the x-axis direction. Further, each of the three vibration arms 5 to 7 is formed into a longitudinal shape, its end portion is a fixed end, and its distal end portion becomes a free end.

Drive Arm 5

As illustrated in FIG. 1 and FIG. 2, the drive arm 5 extends in the Y-axis direction (first direction). Such a vibration arm 5 is a y-z plane, and has a cross-sectional shape asymmetrical with respect to a center line (also referred to as a second center line) L' in the width direction (X-axis direction) of the drive arm 5 and a center line (also referred to as a first center line) L" in the thickness direction (Z-axis direction) thereof. Since the drive arm 5 has such an asymmetric shape, as described later, it is possible to make the drive arm 5 bend and vibrate (hereinafter, also referred to as "oblique vibration") in a direction having both direction components of the x-axis direction and the z-axis direction, in other words, in the inclined direction against both the x-axis and the z-axis.

Specifically, as illustrated in FIG. 3, the drive arm 5 includes an upper surface (a first main surface) 511 and a lower surface (a second main surface) 512 which are opposed (separated) in the z-axis direction and are formed in the x-y plane having a front and back relationship, and a pair of side surfaces (a first side surface and a second side surface) 513, 514 each connecting the upper surface 511 and the lower surface 512.

In the drive arm 5, a first groove 55 which is open is formed on the upper surface 511, and a second groove 56 which is open is formed on the lower surface 512. The first groove 55 and the second groove 56 respectively extend in the y-axis direction (a first direction), and can be formed across the connecting portion with the base 4. Each of the first groove 55 and the second groove 56 has a depth in the z-axis direction. Each of the first groove 55 and the second groove 56 has a rectangular cross-section in FIG. 3, without being particularly limited, and may have other cross-sectional shapes, for example, a substantially U-like cross-sectional shape, or a cross-sectional shape illustrated in FIG. 14 or FIG. 15 described later.

In the drive arm 5, in a plan view seen from a direction perpendicular to a first main surface 511 (a plan view shown in FIG. 1), the first groove 55 and the second groove 56 are provided to shift in opposite directions to each other, in a direction which is perpendicular to the y-direction in which the vibration arm 5 extends and parallel to the first main surface 511 (x direction, second direction) (see FIG. 3). In other words, in a plan view seen from a direction perpendicular to the first main surface 511, the first groove 55 is provided to shift further than the second groove 56 in a direction away from the first side surface 513.

Further, in the drive arm 5, in a cross-section (an x-z plane illustrated in FIG. 3) which is perpendicular to the y-direction in which the drive arm 5 extends, a length a1 between the first open end OE1 on the first side surface 513 side of the first groove 55 and the first end E1 at which the first main surface 511 and the first side surface 513 intersect each other is longer than a length b1 between the second open end OE2 on the second side surface 514 side of the first groove 55 and the second end E2 at which the first main surface 511 and the second side surface 514 intersect each other. In other words, the following unequal Expression (1) is satisfied.

$$a1 > b1 \quad (1)$$

Similarly, in the drive arm 5, in the x-z plane, a length a2 between the third open end OE3 on the second side surface 514 side of the second groove 56 and the third end E3 at which the second main surface 512 and the second side surface 514 intersect each other is longer than a length b2 between the fourth open end OE4 on the first side surface 513 side of the second groove 56 and the fourth end E4 at which the second main surface 512 and the first side surface 513 intersect each other. In other words, the following Expression (2) is satisfied.

$$a2 > b2 \quad (2)$$

If describing Expressions (1) and (2) in other words, in a second direction x which is parallel to the first main surface 511 and perpendicular to a first direction y in which the vibration arm 5 extends, the first open end OE1 is located closer to one side than the fourth open end OE4, and similarly, the second open end OE2 is located closer to one side than the third open end OE3.

The first groove 55 and the second groove 56 are formed in rotational symmetry with respect to the center axis O of the drive arm 5 which is an intersection between the first and second center axes L' and L". Thus, the mass and shape can be made substantially equal on the one side and the other side of a bisection point P of the drive arm 5, and the drive arm 5 has a balanced shape in terms of mass and inertia.

In such a drive arm 5, a pair of first drive electrodes and a pair of second drive electrodes 82 are formed. Specifically, one of the pair of first drive electrodes 81 is formed in the inner surface of the first groove 55, and the other of the pair of first drive electrodes 81 is formed in the inner surface of the second groove 56. Further, one of the pair of second drive electrodes 82 is formed on the first side surface 513, the other of the pair of second drive electrodes 82 is formed on the second side surface 514.

According to such an electrode arrangement, as illustrated in FIG. 2, an AC power source 900 is connected to the first and second drive electrodes 81, 82, and thus the electric field generated between the first and second drive electrodes 81, 82 can be applied to the drive arm 5. This enables the drive arm 5 to bend and vibrate.

These first and second drive electrodes 81, 82 do not have particular limit to the components, and can be formed of metallic material such as gold (Au), gold alloy, platinum (Pt), aluminum (Al), aluminum alloy, silver (Ag), silver alloy, chromium (Cr), chrome alloy, copper (Cu), molybdenum (Mo), niobium (Nb), tungsten (W), iron (Fe), titanium (Ti), cobalt (Co), zinc (Zn), zirconium (Zr), and conductive material such as indium tin oxide (ITO).

Among them, as the material of the first and second drive electrodes 81, 82, it is preferable to use metal (gold, gold alloy) mainly containing gold as material, and platinum, and more preferable to use metal (especially gold) mainly containing gold as material. Since Au is excellent in conductivity (an electrical resistance is small) and is excellent in resistance to oxidation, it is suitable as electrode material. Further, Au can easily be patterned by etching compared with the Pt.

For example, when the first and second drive electrodes 81, 82 are formed of gold and the piezoelectric substrate is formed of quartz, adhesion between them is low. Therefore, in such a case, it is preferable to provide a base layer made of Ti, Cr or the like between the first and the second drive electrode 81, 82 and the piezoelectric substrate. This makes the adhesion between the base layer and the drive arm 5 and the adhesion between the base layer and the first and second drive electrodes 81, 82 excellent. As a result, it is possible to prevent the first and second drive electrodes 81, 82 from being separated from the drive arm 5, and to make the vibrating element 2 excellent in reliability.

Drive Arm 6

The drive arm 6 has the same configuration (shape) as in the drive arm 5, except for being formed symmetrically with respect to the drive arm 5 in the y-z plane, as illustrated in FIG. 2. Therefore, the description regarding the configuration of the drive arm 6 is omitted.

Even in such a drive arm 6, as illustrated in FIG. 2, in the same manner as the drive arm 5, a pair of first drive electrodes 81 and a pair of second drive electrodes 82 are formed. Specifically, one of the pair of first drive electrodes 81 is formed in a first side surface 613, and the other of the pair of first drive electrodes 81 is formed in a second side surface 614. Further, one of the pair of second drive electrodes 82 is formed in the inner surface of a first groove 65, and the other of the pair of second drive electrodes 82 is formed in the inner surface of a second groove 66.

According to such an electrode arrangement, as illustrated in FIG. 2, the AC power source 900 is connected to the first and second drive electrodes 81, 82, and thus the electric field generated between the first and second drive electrodes 81, 82 can be applied to the drive arm 5. This enables the drive arm 5 to bend and vibrate.

Adjustment Arm 7

The adjustment arm 7 has a constant thickness (a length in the z-axis direction) and a constant width (a length in the x-axis direction), over the whole area in the longitudinal direction. Such an adjustment arm 7 vibrates in accordance with the vibration of the drive arms 5, 6.

Vibration Operation

Hitherto, the structure of the vibrating element 2 has been described. Such a vibrating element 2 is driven in the following manner. If the AC power source 900 illustrated in FIG. 2 applies an alternating voltage between the first and second drive electrodes 81, 82, the drive arms 5, 6 respectively have asymmetrical cross-sectional shapes with respect to both the center lines L', L", such that the drive arms 5, 6 perform the oblique vibration as illustrated in FIG. 4 due to an in-plane vibration in the x-z plane. In other words, the first drive arm 5 and the second drive arm 6 are arranged in line symmetry with respect to the y-axis, vibrate in opposite phases in the x-direction parallel to the first main surface 511 in the x-z cross section, and vibrate in the same phase in the z-direction perpendicular to the first main surface 511 in the x-z cross section. At this time, since the bending vibrations in the x-axis direction of the drive arms 5, 6 are canceled, the adjustment arm 7 hardly vibrates in the x-axis direction. Meanwhile, since the bending vibrations in the z-axis direction of the drive arms 5, 6 are not canceled, the adjustment arm 7 bends and vibrates in the z-axis direction, in an opposite direction to the drive arms 5, 6, so as to balance with the drive arms 5, 6.

In such a vibration, since the drive arms 5, 6 vibrate symmetrically with respect to the y-z plane, the vibration of the x-axis direction component among the bending vibration of the drive arm 5, and the vibration of the x-axis direction component among the bending vibration of the drive arm 6 are balanced and canceled. Therefore, vibration in the x-axis direction is not transmitted to the adjustment arm 7, and the adjustment arm 7 hardly vibrates in the x-axis direction. Further, since the drive arms 5, 6 and the adjustment arm 7 bend and vibrate on the opposite side in the z-axis direction, the vibration of the z-axis direction component among the bending vibrations of the drive arms 5, 6 and the vibration in the z-axis of the adjustment arm 7 are balanced and canceled. Therefore, according to the vibrating element 2, effectively, it is possible to prevent vibration leakage.

In particular, in this embodiment, since two drive arms 5, 6 vibrating obliquely are located at both ends of the base 4, the drive arms 5, 6 can be driven with good balance in an out-of-plane direction and an in-plane direction, and thus it is possible to more stably cause the drive arms 5, 6 and the adjustment arm 7 to vibrate. Therefore, it is possible to prevent vibration leakage more effectively. Further, since the vibrating element 2 has the adjustment arm 7, the vibrations (the translation movements) in the z-axis direction of the drive arms 5, 6 are automatically canceled, and thus the torque is canceled and reduced.

According to the vibrating element 2 in this embodiment, in contrast with the vibrating element in JP-A-2013-157703, it is possible to further have the following features. During the above-mentioned oblique vibration, since it is possible to ensure the wall thickness a1 of the vibrating element on the second main surface 512 side in the area facing the second groove 56 and the wall thickness a2 of the vibrating element 2 on the second main surface 512 side in the area facing the first groove 55 to be thicker, the mechanical strength is enhanced. Thus, the rigidity of the vibrating element 2 is increased, and it is possible to prevent the unnecessary vibration such as torsional vibration from being applied.

Detailed Structure of Vibrating Element

First, in this embodiment, the thick portions of the drive arm 5 over the maximum width of the x-z cross-section can be formed successively along the first center line L" bisecting the distance between the first main surface 511 and the second main surface 512. In this way, since the drive arm 5 over the maximum width of the x-z cross-section can be formed successively on the first center line L" which is interposed between the first and second grooves 55, 56, it is possible to further suppress the occurrence of twisting between the sites on the first and second grooves 55, 56 sides having the first center line L" interposed therebetween. It is possible to suppress the torsional vibration even in the drive arm 6 in the same way.

Next, in this embodiment, the first groove 55 can be formed to be open to the first main surface 511 between the second center line L' and the second side surface 514, here, the second center line L' bisects the maximum width between the first side surface 513 and the second side surface 514, and the second groove 56 is formed to be open to the second main surface 512 between the second center line L' and the first side surface 513.

In this way, the wall thickness a1 of the drive arm 5 on the first main surface 511 side in the area facing the second groove 56 and the wall thickness a2 of the drive arm 5 on the second main surface 512 side in the area facing the first groove 55 can be made thicker. Thus, the rigidity of the vibrating element 2 is further increased, and the application of unwanted vibration such as torsional vibration can be reduced. It is possible to suppress the torsional vibration even in the drive arm 6 in the same way.

Modification Example of Vibration Portion

FIG. 5 is a sectional view illustrating a modification example of the drive arm 5 illustrated in FIG. 3. In FIG. 5, unlike FIG. 3, the first groove 55 and the second groove 56 are open at both sides of the second center line L'. In other words, in the plan view seen from the direction perpendicular to the first main surface 511, apart of the first groove 55 and a part of the second groove 56 overlap each other.

In the modification example of FIG. 5, the opening widths of the first groove 55 and the second groove 56 can be made larger than those in FIG. 3 and thus it is possible to reduce the impedance of the drive arm 5. Similarly, it is possible to reduce the impedance even in the drive arm 6. Further, even in FIG. 5, the thick portions of the drive arm 5 over the maximum width of the x-z cross-section can be formed successively along the first center line L", and thus it is possible to ensure the mechanical strength such as torsional rigidity of the drive arms 5, 6.

Numerical Limitation to the Shape of Vibration Portion

The following is a description of the numerical limitation to the shape of the drive arm 5, and the numerical limitation may be applied also to the drive arm 6. In any of the embodiments of FIG. 3 and FIG. 5, preferably Expression (3), and further preferably Expression (4) is satisfied, and thus the wall thicknesses a1, a2 can be secured to be thicker than in JP-A-2013-157703.

$$a1 > 2 \times b1 \text{ and } a2 > 2 \times b2 \tag{3}$$

$$a1 > 3 \times b1 \text{ and } a2 > 3 \times b2 \tag{4}$$

In any of the embodiments of FIG. 3 and FIG. 5, if the distance between the first main surface 511 and the second main surface 512 is set to t, the depth d1 of the first groove 55 and the depth d2 of the second groove 56 satisfy the following Expression (5).

$$d1+d2<t \quad (5)$$

In other words, the sum d1+d2 of the depths of the first and second grooves 55, 56 is smaller than the thickness t of the drive arm 5. In this case, preferably Expression (6), further preferably Expression (7), and further preferably Expression (8) can be satisfied. Here, as the depths d1 and d2 of the first and second grooves 55, 56 become deeper, the impedance of the vibration arm 5 is lowered, but processing is difficult. As the depths d1 and d2 of the first and second grooves 55, 56 become shallower, processing becomes easier, and it is possible to increase the mechanical strength, by leaving a thick portion of the maximum width in the region between the first groove and the second groove 55 and 56.

$$0.3t \le d1+d2 \le 0.95t \quad (6)$$

$$0.4t \le d1+d2 \le 0.9t \quad (7)$$

$$0.5t \le d1+d2 \le 0.8t \quad (8)$$

In any of the embodiments of FIG. 3 and FIG. 5, if the distance between the first main surface 511 and the second main surface 512 is set to t, the depth d1 of the first groove 55 and the depth d2 of the second groove 56 can satisfy the following Expression (9).

$$d1<0.5t, \text{ and } d2<0.5t \quad (9)$$

Through this numerical limitation, since drive arms 5 can be formed successively over the maximum width of the x-z cross-section on the first center line L" which is interposed between the first and second grooves 55, 56, it is possible to further suppress the occurrence of torsion between the sites on the first and second grooves 55, 56 sides having the first center line L" interposed therebetween. In this case, preferably Expression (10), further preferably Expression (11), and further preferably Expression (12) can be satisfied. As described above, as the depths d1 and d2 of the first and second grooves 55, 56 become deeper, the impedance of the drive arm 5 is lowered, but processing is difficult. As the depths d1 and d2 of the first and second grooves 55, 56 become shallower, the processing becomes easier, and it is possible to increase the mechanical strength, by leaving a thick portion of the maximum width in the region between the first groove and the second groove 55 and 56.

$$0.15t \le d1 \le 0.475t, \text{ and } 0.15t \le d2 \le 0.475t \quad (10)$$

$$0.2t \le d1 \le 0.45t, \text{ and } 0.2t \le d2 \le 0.45t \quad (11)$$

$$0.25t \le d1 \le 0.4t, \text{ and } 0.25t \le d2 \le 0.4t \quad (12)$$

In the embodiment illustrated in FIG. 5, in the x-z cross section, if the maximum width between the first side surface 513 and the second side surface 514 is set to W, and the opening width of the first groove 55 and the opening width of second groove 56 are set to M, preferably Expression (13), further preferably Expression (14), and further preferably Expression (15) can be satisfied. As the opening widths M of the first groove and the second groove become broader, the impedance CI is lowered, an oblique vibration component becomes larger, and the processing becomes easier. However, the wider the opening width M is, the smaller the mechanical strength of the drive arm 5 is. In the case of the embodiment of FIG. 3, it is satisfied that 0.1 W≤M<0.5 W.

$$0.1W \le M \le 0.8W \quad (13)$$

$$0.2W \le M \le 0.7W \quad (14)$$

$$0.35W \le M \le 0.6W \quad (15)$$

Package

Next, a description will be made regarding a package 9 that accommodates and fixes the vibrating element 2.

Figure 6:
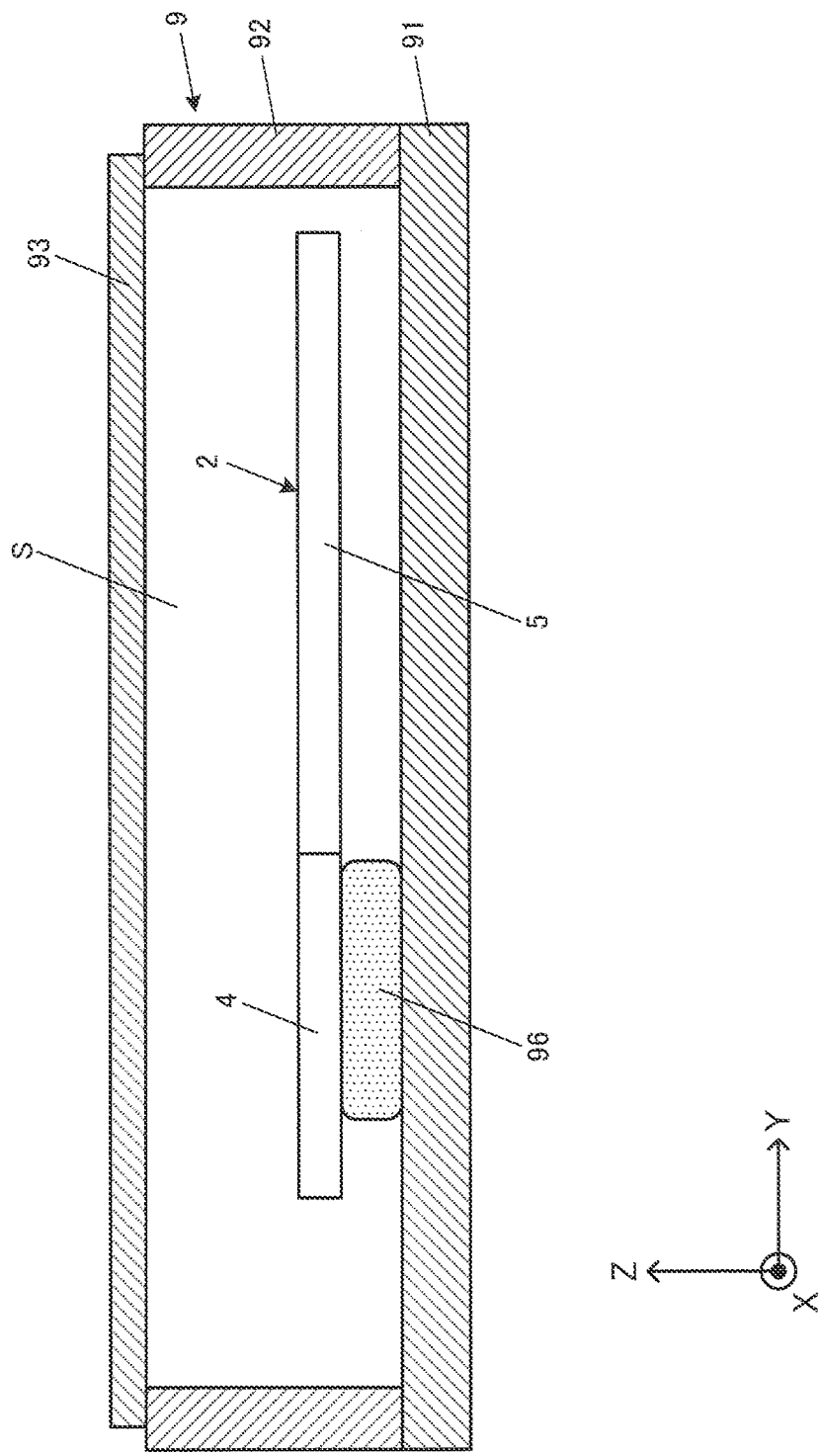
FIG. 6 is a sectional view illustrating a package that accommodates and fixes the vibrating element.

As illustrated in FIG. 6, the package 9 includes a plate-like base substrate 91, a frame-shaped frame member 92, and a plate-like lid member 93. The base substrate 91, the frame member 92 and the lid member 93 are stacked in this order from the lower side to the upper side. The base substrate 91 and the frame member 92 are formed of a ceramic material or the like described later, and are joined by being integrally sintered to one another. The frame member 92 and the lid member 93 are joined by an adhesive or a brazing material or the like. Then, the package 9 accommodates the vibrating element 2 in the internal space S which is defined by the base substrate 91, the frame member 92, and the lid member 93. In addition, the package 9 can accommodate an electronic component (oscillation circuit) for driving the vibrating element 2, in addition to the vibrating element 2.

As the constituent material of the base substrate 91, it is preferable to use material having insulating properties (non-conductive), for example, various glass materials, various ceramic materials such as oxide ceramics, nitride ceramics, and carbide ceramics, and various resin materials such as polyimide. Further, as the constituent material of the frame member 92 and the lid member 93, it is possible to use, for example, the same constituent materials as those of the base substrate 91, various metal materials such as Al, and Cu, various glass materials, and the like.

The vibrating element 2 described above is fixed on the upper surface of the base substrate 91, through the fixing member 96. The fixing member 96 is made of, for example, an epoxy-based, a polyimide-based, or a silicon-based adhesive. Such a fixing member 96 is formed by applying an uncured (not-hardened) adhesive on the base substrate 91, placing the vibrating element 2 on the adhesive, and curing or solidifying the adhesive. Thus, the vibrating element 2 is securely fixed to the base substrate 91.

In addition, this fixation may be performed using an epoxy-based, a polyimide-based, or a silicon-based conductive adhesive containing conductive particles.

Second Embodiment

Next, a description will be made regarding a second embodiment of the vibrating element according to the invention.

Figure 7:
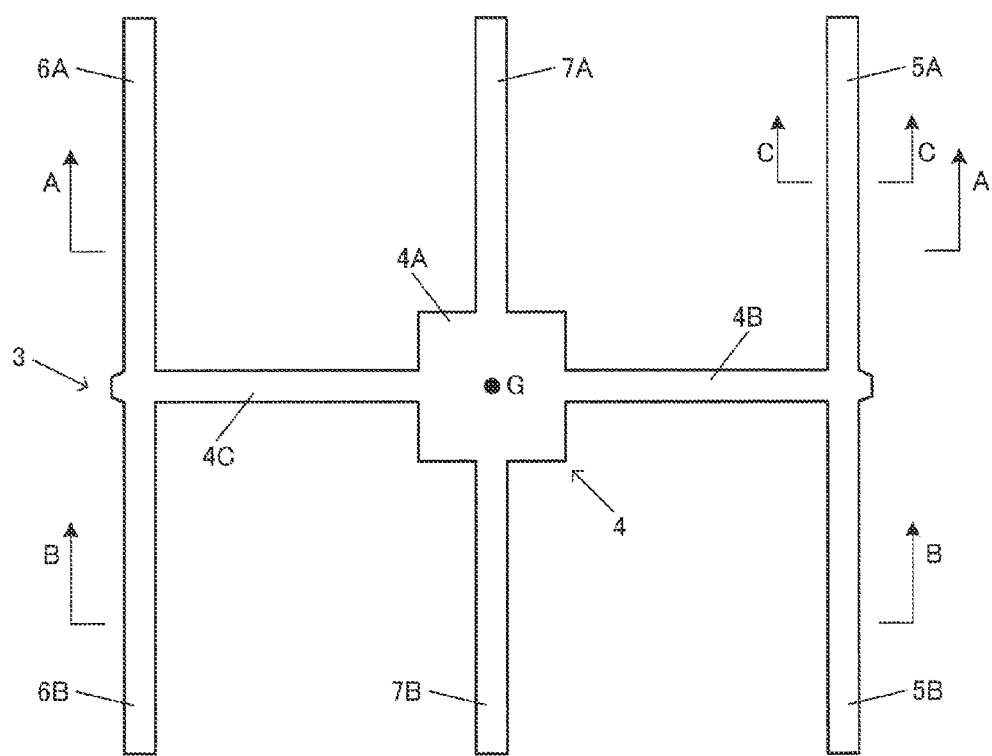
FIG. 7 is a plan view illustrating a gyro sensor element provided with the vibrating element according to a second embodiment of the invention.
Figure 7:
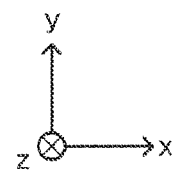

FIG. 7 is a sectional view of the vibration arm of the vibrating element provided in the vibrating element according to a second embodiment of the invention. Hereinafter, the second embodiment will be described by focusing on differences from the embodiment described above, and a description of the same matters will be omitted.

A gyro (an angular velocity sensor) 3 illustrated in FIG. 7 is a gyro sensor capable of detecting the angular velocity ωz around the z-axis, and the angular velocity ωy around the y-axis. The gyro sensor 3 having a spread in the x-y plane and a thickness in the z-axis direction includes a base 4, a first detection arm 7A, a second detection arm 7B, a first drive arm 5A, a second drive arm 6A, a third drive arm 5B, and a fourth drive arm 6B. The base 4 includes a base body 4A, a first connecting arm 4B and a second connecting arm 4C, which are connected to the base body 4A.

The third drive arm 5B extends in a direction opposite to the first drive arm 5A, along the y-direction from the base 4. The fourth drive arm 6B extends in a direction opposite to the second drive arm 6A, along the y-direction from the base 4. The first and third drive arms 5A, 5B have, for example, the same shape as the first drive arm 5 illustrated in FIG. 2, and the second and fourth drive arms 6A, 6B have, for example, the same shape as the second drive arm 6 illustrated in FIG. 2.

Figure 8:
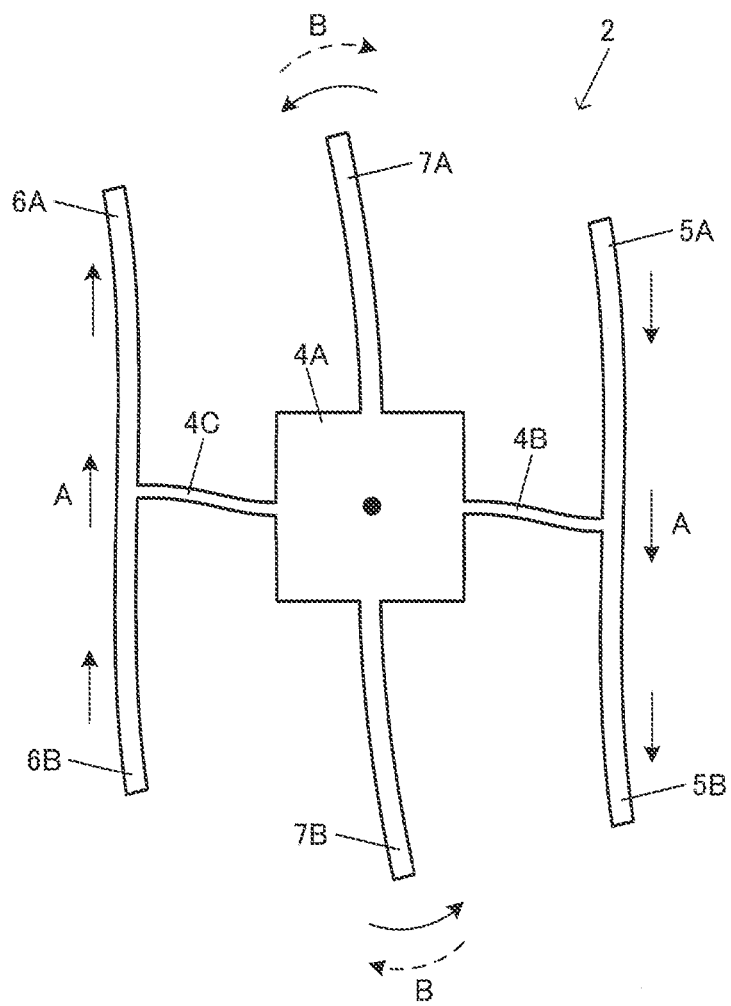
FIG. 8 is a plan view illustrating a detected state when the gyro sensor element is rotated around a z-axis.

When an angular velocity ωz around the z-axis is applied to the gyro sensor 3, as illustrated in FIG. 8, a Coriolis force A acts, and vibrations indicated by an arrow B are generated, with the Coriolis force A as a driving force (z-axis angular velocity detection vibration mode). In this case, deformation occurs in an opposite direction with respect to the x-axis in the first and second detection arms 7A, 7B. Further, in the detection vibration mode, a frequency is preferably within ±10% of the drive frequency. In addition, with respect to the vibration directions of the first and second detection arms 7A, 7B, the first and second detection arms 7A, 7B vibrate in the same rotation direction around the z-axis. This is because since the first to fourth drive arms 5A, 6A, 5B, and 6B vibrate as illustrated in FIG. 8 by the action of the Coriolis force A and the first and second detection arms 7A, 7B extend to the upper side and the lower side having the base 4 interposed therebetween, respectively, the first detection arm 7A is deformed corresponding to the first and second drive arms 5A, 6A, and the second detection arm 7B is deformed corresponding to the third and fourth drive arms 5B, 6B.

Figure 9:
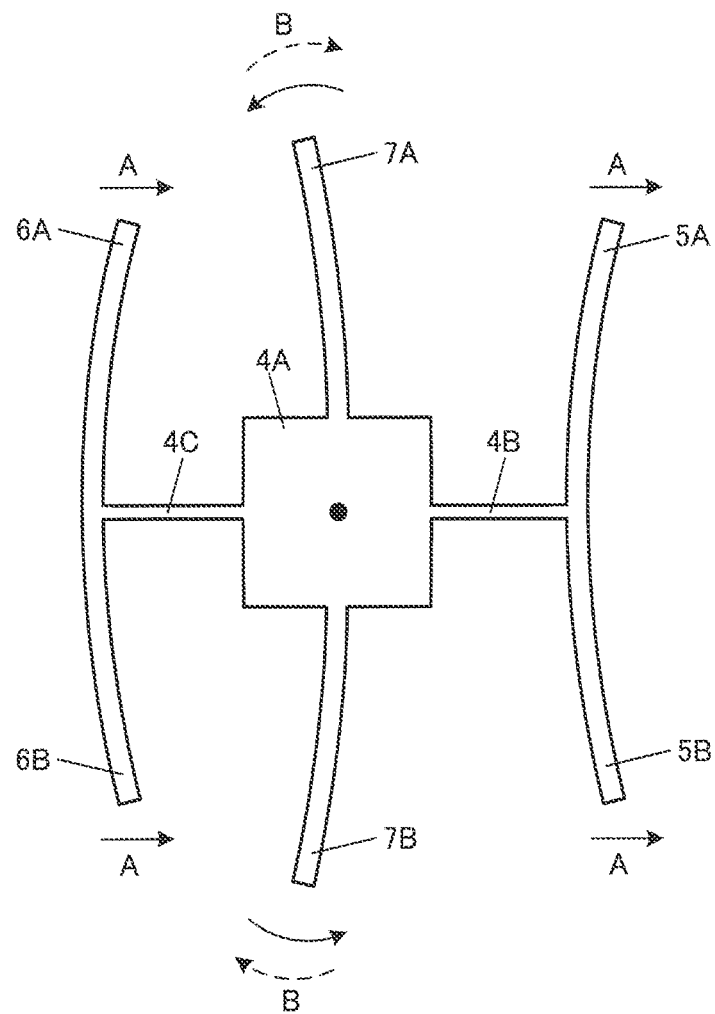
FIG. 9 is a plan view illustrating a detected state when the gyro sensor element is rotated around a y-axis.

Meanwhile, when the angular velocity ωy around the y-axis is applied to the gyro sensor 3, as illustrated in FIG. 9, the Coriolis force A acts, and vibrations indicated by an arrow B are generated, with the Coriolis force A as a driving force (y-axis angular velocity detection vibration mode). In this case, deformation occurs in the same direction with respect to the x-axis in the first and second detection arms 7A, 7B. Further, in the detection vibration mode, a frequency is preferably within ±10% of the drive frequency. In addition, with respect to the vibration directions of the first and second detection arms 7A, 7B, the first and second detection arms 7A, 7B vibrate in the same direction around the x-axis. This is because since the first to fourth drive arms 46 to 49 vibrate as illustrated in FIG. 9 by the action of the Coriolis force A, and the Coriolis force A acts in the same direction as the x-axis and in the opposite direction to the first to fourth drive arms 5A, 5B, 6A, 6B on the first and second detection arms 7A, 7B, the first and second detection arms 7A, 7B vibrate in the same direction as the x-axis.

Figure 10:
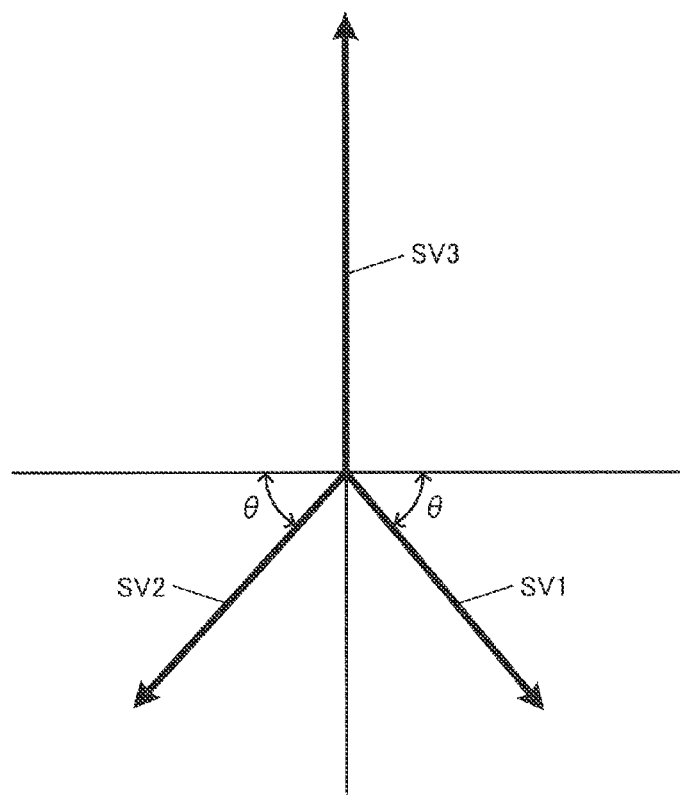
FIG. 10 is a diagram illustrating a vibration component in a z-direction of the detection arm corresponding to the z-component of the oblique vibration which acts when a drive arm is driven.

Here, the detection sensitivity of the angular velocity ωy around the y-axis depends on the amplitude of the vibration in the z-direction occurring in the first and second detection arms 7A, 7B, due to the oblique vibration during the driving of the first to fourth drive arms 5A, 6A, 5B, and 6B. FIG. 10 illustrates a vibration vector SV3 in the z-direction of the first detection arm 7A corresponding to the z-components of the oblique vibration vectors SV1 and SV2 of the first and second drive arms 5A, 6A. It can be seen that the larger the angle θ of oblique vibration is, the larger the vibration vector SV3 is. The angle θ of oblique vibration can be increased by the structure of the first drive arm 5 of FIG. 3 or FIG. 4 described above. Thus, the amplitude of the vibration in the z-direction occurring in the first and second detection arms 7A, 7B is increased, and the detection sensitivity of the angular velocity ωy around the y-axis can be increased. Further, it is possible to suppress the vibration other than the oblique vibration, by the structure of the first drive arm 5 in FIG. 3 or FIG. 5 described above. Thus, it is possible to suppress noise, improve temperature characteristics, and detect an angular velocity signal stably.

In the gyro sensor 3, if the angular velocity ωz around the z-axis described above is added, it is possible to detect the angular velocity ωz and the angular velocity ωy independently, by utilizing a difference between the vibration directions of the detection arms 7A and 7B when the angular velocity ωy around the y-axis is applied. To be specific, when the angular velocity ωz is applied, the signal (voltage) V1 that is extracted from the first detection arm 7A is the signal (voltage) +Vz due to the angular velocity ωz, and the signal (voltage) V2 that is extracted from the second detection arm 7B is the signal (voltage) −Vz due to the angular velocity ωz. In other words, it is satisfied that V1=+Vz, and V2=−Vz.

On the other hand, when the angular velocity ωy is applied, the signal V1 that is extracted from the first detection arm 7A is the signal +Vy due to the angular velocity ωy, and the signal V2 that is extracted from the second detection arm 7B is the signal +Vy due to the angular velocity ωY. In other words, it is satisfied that V1=+Vy, and V2=+Vy. In addition, the signals V1, V2 have the same signs because signals of opposite signs with respect to the angular velocity around the z-axis are generated.

Therefore, if the angular velocity ωyz around an axis having both direction components of the y-axis direction and z-axis direction (that is, an inclined axis with respect to both the y-axis and the z-axis) is applied to the gyro sensor 3, the signal V1 extracted from the first detection arm 7A is (+Vy)+(+Vz), and the signal V2 extracted from the second detection arm 7B is (+Vy)+(−Vz). In other words, it is satisfied that V1=Vy+Vz, and V2=Vy−Vz.

By adding or subtracting the signals V1, V2, it is possible to separate the angular velocity ωy around the y-axis and the angular velocity ωz around the z-axis, of the angular velocity ωyz, and to detect the angular velocity ωy and the angular velocity ωz, independently and respectively. Specifically, it is satisfied that V1+V2=2 Vy, and it is possible to eliminate a signal Vz due to the angular velocity ωz. Thus, the angular velocity ωy around the y-axis can be obtained. Conversely, it is satisfied that V1−V2=2 Vz, and it is possible to eliminate a signal Vy due to the angular velocity ωy. Thus, the angular velocity ωz around the z-axis can be obtained. According to the gyro sensor 3, briefly, it is possible to detect the angular velocity ωy around the y-axis and the angular velocity ωz around the z-axis, respectively and independently. Such calculations can be performed by the detection circuit of an IC chip or the like, not illustrated, connected to the gyro sensor 3.

In addition, the signs of the above-mentioned signals "Vz", "Vy" are opposite by the configuration of the wiring. In other words, there may be a case where "+Vz" is "−Vz", "−Vz" is "+Vz", "+Vy" is "−Vy", and "−Vy" is "+Vy".

Electronic Apparatus

Figure 11:
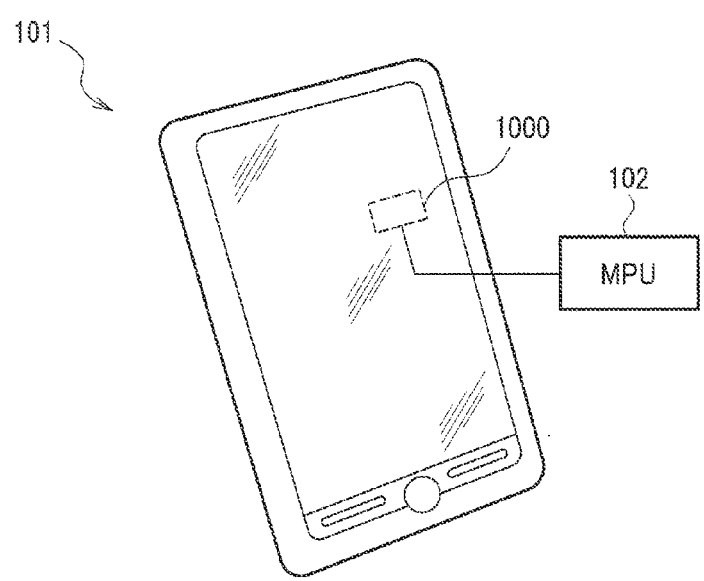
FIG. 11 is a diagram illustrating an electronic apparatus (mobile phone) including the vibrating element according to the invention.

FIG. 11 schematically illustrates a mobile phone for example, a smart phone 101 as a specific example of an electronic apparatus. A gyro sensor 1000 with the vibrating element 2 is built into the smartphone 101. The gyro sensor 1000 can detect the orientation of the smartphone 101. So-called motion sensing is performed. The detection signal of the gyro sensor 1000 can be supplied to, for example, a micro-computer chip (MPU) 102. The MPU 102 can perform a variety of processes according to the motion sensing. In addition, the motion sensing can be used in various electronic apparatuses such as a mobile phone, a portable game machine, a game controller, a car navigation system, a pointing device, a head mounting display, and a tablet PC.

Figure 12:
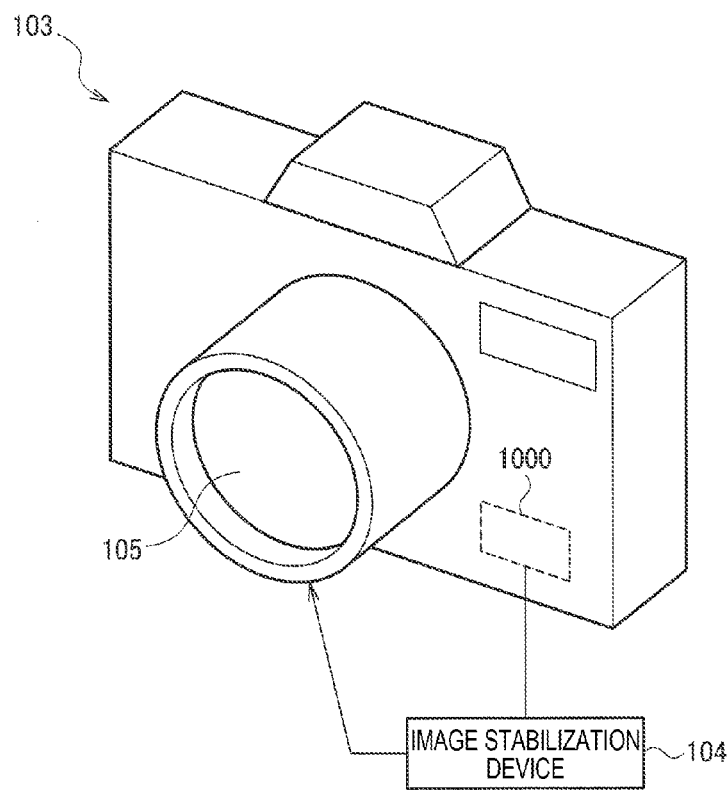
FIG. 12 is a diagram illustrating an electronic apparatus (digital still camera) including the vibrating element according to the invention.

FIG. 12 schematically illustrates a digital still camera (hereinafter referred to as "camera") 103 as another specific example of the electronic apparatus. The gyro sensor 1000 with the vibrating element 2 is built into the camera 103. The gyro sensor 1000 can detect the orientation of the camera 103. The detection signals of the gyro sensor 1000 can be supplied to an image stabilization device 104. The image stabilization device 104 is able to move, for example, a particular lens within a lens set 105, in response to the detection signal of the gyro sensor 1000. Thus, it is possible to correct camera shake. In addition, image stabilization can be utilized in a digital video camera.

Further, in addition to the mobile phone in FIG. 11 and the digital still camera in FIG. 12, the electronic apparatus including the vibrating element 2 is applicable to personal computers (mobile personal computers), ink-jet type discharge devices (for example, ink jet printers), laptop personal computers, TVs, video cameras, video recorders, car navigation devices, pagers, electronic notebooks (having communication functions), electronic dictionaries, electronic calculators, electronic game machines, word processors, workstations, TV phones, security television monitors, electronic binoculars, POS terminals, medical equipment (for example, electronic thermometers, blood pressure meters, blood glucose meters, electrocardiogram measurement apparatuses, ultrasonic diagnostic equipment, electronic endoscopes), fish finders, various types of measurement equipment, instruments (for example, vehicles, aircrafts, ship gauges), flight simulators or the like.

Moving Object

Figure 13:
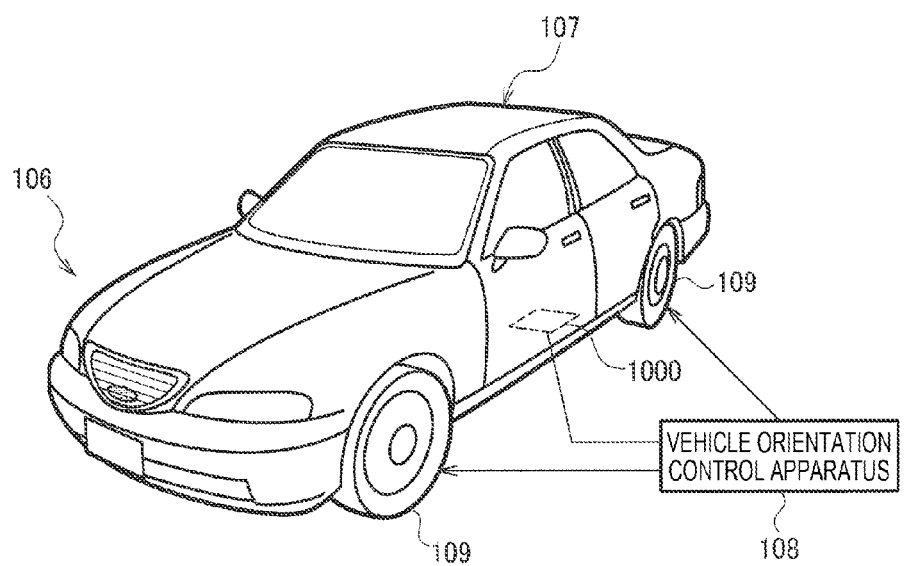
FIG. 13 is a diagram illustrating a moving object (vehicle) including the vibrating element according to the invention.

FIG. 13 schematically illustrates a vehicle 106 as a specific example of a moving object. The gyro sensor 1000 with the vibrating element 2 is built into the vehicle 106. The gyro sensor 1000 can detect the orientation of a vehicle body 107. The detection signals of the gyro sensor 1000 can be supplied to a vehicle orientation control apparatus 108. The vehicle orientation control apparatus 108 can control the hardness of the suspension depending on for example, the orientation of the vehicle body 107, and control the braking of the individual wheels 109. In addition, the orientation control can be used in various moving objects such as a two-legged walking robot, an aircraft, and a helicopter.

Hitherto, the vibrating element, and the electronic apparatus with the vibrating element have been described based on the illustrated embodiments, but the invention is not limited thereto, and the configurations of respective units can be substituted with those of any configuration having the same function. Further, the invention, among the respective embodiments, may be a combination of any two or more configurations (features).

Further, if necessary, a mass portion (hammer head) having a greater cross section area than that of a base end portion may be provided in the tip portion of each vibration arm. Thus, it is possible to make the vibrating element more compact, and to further lower the frequency of the bending vibration of the vibration arm.

Further, the vibrating element according to the invention is applicable to a piezoelectric vibrator such as a crystal vibrator (SPXO), a voltage-controlled crystal vibrator (VCXO), a temperature compensated crystal vibrator (TCXO), and an oven controlled crystal vibrator (OCXO).

Figure 14:
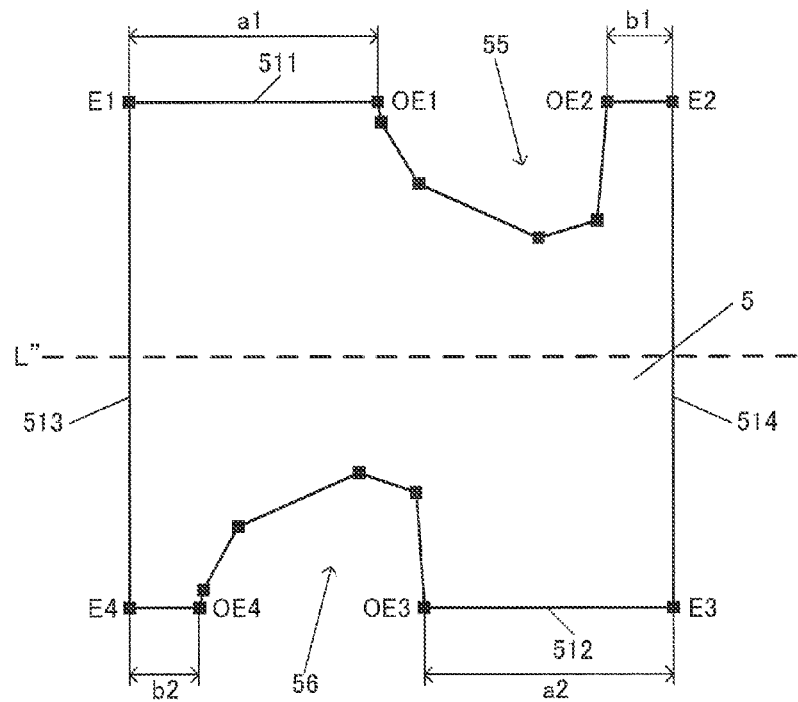
FIG. 14 is a sectional view illustrating a modification example of the drive arm illustrated in FIG. 3.
Figure 15:
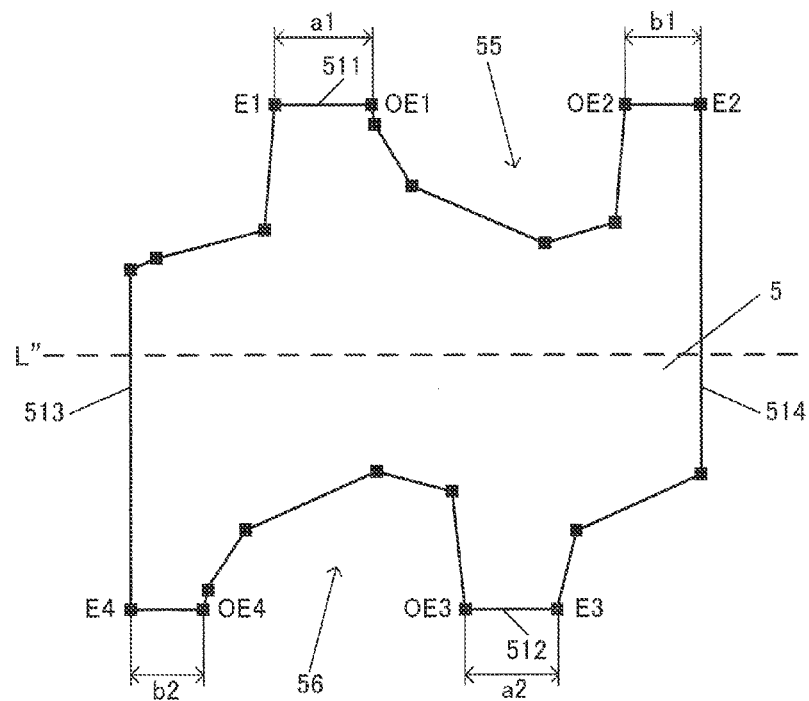
FIG. 15 is a sectional view illustrating another modification example of the drive arm illustrated in FIG. 3.

The shapes of the grooves 55, 56 formed in the vibration portions 5, 6 can be a sectional shape illustrated in FIG. 14 or FIG. 15. In other words, the sectional shape of the grooves 55, 56 can be formed depending on the etching characteristics. In particular, in the case of forming the vibrating element 2 with quartz having anisotropy, if the quartz is wet-etched, it can be etched into a shape illustrated in FIG. 14 or FIG. 15. In addition, as illustrated in FIG. 15, the corners of the vibration portions 5, 6 may be chamfered. Even in this case, it is satisfied that a1>b1 and a2>b2, and moreover, the vibration portion can have a maximum width successively on the first center line L".

The entire disclosure of Japanese Patent Application No: 2014-193775, filed Sep. 24, 2014 is expressly incorporated by reference herein.

What is claimed is:

1. A vibrating element comprising:
a base; and
a vibration portion extending to a first direction from the base,
wherein the vibration portion includes
a first main surface,
a second main surface located on the opposite side of the first main surface,
a first side surface,
a second side surface located on the opposite side of the first side surface,
a first groove formed on the first main surface, and
a second groove formed on the second main surface,
wherein in a plan view seen from a direction perpendicular to the first main surface, the first groove is provided to shift further from the first side surface than the second groove,
wherein in a cross section perpendicular to the first direction in which the vibration portion extends, a length a1 between a first open end on the first side surface side of the first groove and a first end at which the first main surface and the first side surface intersect each other is longer than a length b1 between a second open end on the second side surface side of the first groove and a second end at which the first main surface and the second side surface intersect each other,
wherein in the cross section, a length a2 between a third open end on the second side surface side of the second groove and a third end at which the second main surface and the second side surface intersect each other is longer than a length b2 between a fourth open end on the first side surface side of the second groove and a fourth end at which the second main surface and the first side surface intersect each other, and
wherein if a depth of the first groove is set to d1, a depth of the second groove is set to d2, and a distance between the first main surface and the second main surface is set to t, it is satisfied that d1+d2<t.

2. The vibrating element according to claim 1,
wherein along a first center line bisecting a distance between the first main surface and the second main surface, the vibration portion is formed continuously over a maximum width of the cross section.

3. The vibrating element according to claim 2,
wherein in a plan view viewed from a direction perpendicular to the first main surface, a portion of the first groove and a portion of the second groove are overlapped.

4. The vibrating element according to claim 2,
wherein the first groove is formed so as to be open to the first main surface between a second center line and the second side surface, the second center line bisecting a maximum width between the first side surface and the second side surface, and wherein the second groove is formed to be open to the second main surface between the second center line and the first side surface.

5. The vibrating element according to claim 1,
wherein it is satisfied that $a1>2\times b1$ and $a2>2\times b2$.

6. The vibrating element according to claim 1,
wherein it is satisfied that $0.3\ t\leq d1+d2\leq 0.95\ t$.

7. The vibrating element according to claim 1,
wherein it is satisfied that $0.4\ t\leq d1+d2\leq 0.9\ t$.

8. The vibrating element according to claim 1,
wherein it is satisfied that $0.5\ t\leq d1+d2\leq 0.8\ t$.

9. The vibrating element according to claim 2,
wherein if a distance between the first main surface and the second main surface is set to t, a depth d1 of the first groove and a depth d2 of the second groove satisfy that $d1<0.5\ t$ and $d2<0.5\ t$.

10. The vibrating element according to claim 9,
wherein it is satisfied that $0.15\ t\leq d1\leq 0.475\ t$ and $0.15\ t\leq d2\leq 0.475\ t$.

11. The vibrating element according to claim 9,
wherein it is satisfied that $0.2\ t\leq d1\leq 0.45\ t$ and $0.2\ t\leq d2\leq 0.45\ t$.

12. The vibrating element according to claim 9,
wherein it is satisfied that $0.25\ t\leq d1\leq 0.4\ t$ and $0.25\ t\leq d2\leq 0.4\ t$.

13. The vibrating element according to claim 1,
wherein in the cross section, if a maximum width between the first side surface and the second side surface is set to W, and an opening width of the first groove and an opening width of the second groove are set to M, it is satisfied that $0.1\ W\leq M\leq 0.8\ W$.

14. The vibrating element according to claim 13,
wherein it is satisfied that $0.2\ W\leq M\leq 0.7\ W$.

15. The vibrating element according to claim 1,
wherein in a second direction which is perpendicular to the first direction in which the vibration portion extends, and is parallel to the first main surface, the first open end is located closer to one side than the fourth open end, and the second open end is located closer to one side than the third open end.

16. The vibrating element according to claim 1, further comprising:
a first drive unit and a second drive unit that are configured with the vibration portions extending in parallel to the first direction from the base,
wherein the first drive unit and the second drive unit are arranged in line symmetry with respect to a line along the first direction, vibrate in opposite phases in a direction parallel to the first main surface in the cross section, and vibrate in the same phase in a direction perpendicular to the first main surface in the cross section.

17. The vibrating element according to claim 16, further comprising:
a detection unit that bends and vibrates in response to a Coriolis force applied to the first drive unit and the second drive unit, when the vibrating element rotates.

18. An angular velocity sensor comprising:
the vibrating element according to claim 1; and
a detection circuit that detects an angular velocity around an axis parallel to the first direction of the vibrating element.

19. An electronic apparatus comprising:
the angular velocity sensor according to claim 18.

20. A moving object comprising:
the angular velocity sensor according to claim 18.

\* \* \* \* \*